(12) United States Patent
Emer

(10) Patent No.: US 7,268,890 B2
(45) Date of Patent: Sep. 11, 2007

(54) DEVICE AND METHOD FOR WAVEFRONT MEASUREMENT OF AN OPTICAL IMAGING SYSTEM, AND A MICROLITHOGRAPHY PROJECTION EXPOSURE MACHINE

(75) Inventor: Wolfgang Emer, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 207 days.

(21) Appl. No.: 10/983,593

(22) Filed: Nov. 9, 2004

(65) Prior Publication Data

US 2005/0200940 A1 Sep. 15, 2005

Related U.S. Application Data

(63) Continuation of application No. PCT/EP2004/000291, filed on Jan. 16, 2004.

(51) Int. Cl.
*G01B 11/02* (2006.01)
(52) U.S. Cl. .................................................. 356/515
(58) Field of Classification Search ................ 356/511, 356/515, 520, 521
See application file for complete search history.

(56) References Cited

U.S. PATENT DOCUMENTS

| 5,828,455 | A | 10/1998 | Smith et al. |
| 5,978,085 | A | 11/1999 | Smith et al. |
| 7,088,458 | B1 * | 8/2006 | Wegmann .................... 356/515 |
| 2002/0191195 | A1 | 12/2002 | Ichihara et al. |
| 2005/0007602 | A1 * | 1/2005 | Haidner et al. ............. 356/521 |

FOREIGN PATENT DOCUMENTS

| DE | 101 09 929 A1 | 11/2001 |
| EP | 0 247 665 | 12/1987 |
| EP | 1 231 514 A1 | 8/2002 |

(Continued)

OTHER PUBLICATIONS

G. T. Reid, Moiré Fringes in Metrology, Optics and Lasers in Engineering, (1984), pp. 63-93, vol. 5, No. 2.

(Continued)

*Primary Examiner*—Gregory J. Toatley, Jr.
*Assistant Examiner*—Michael A Lyons
(74) *Attorney, Agent, or Firm*—Sughrue Mion Pllc

(57) ABSTRACT

A device and a method for wavefront measurement of an optical imaging system, and a microlithography projection exposure machine that is equipped with such a device. The device has a wavefront generating unit that includes an optical element (1) with an object-side periodic structure (2), and a light source unit (20,21) for illuminating the object-side periodic structure with the aid of a measuring radiation. The device also has a detector unit that is arranged on the image side of the imaging system to be measured and that includes an optical element (3) with an image-side periodic structure, and a detector element (52, 52*a*, 52*b*) for detecting an overlay pattern of the imaged object-side periodic structure and image-side periodic structure. The wavefront generating unit is designed to restrict the angular spectrum (6) of the measuring radiation emanating from a respective field point (7), the design being such that the measuring radiation emanating from the respective field point illuminates only in each case a specific subregion of a pupil plane of the optical imaging system.

14 Claims, 4 Drawing Sheets

FOREIGN PATENT DOCUMENTS

| EP | 1 231 517 A1 | 8/2002 |
| EP | 1 355 140 A1 | 10/2003 |
| WO | WO 03/087945 A2 | 10/2003 |

OTHER PUBLICATIONS

C. Elster, Exact two-dimensional wave-front reconstruction from lateral shearing interferograms with large shears, Applied Optics., Oct. 10, 2000, pp. 5353-5359, vol. 39, No. 29.

D. L. Fried, Least-square fitting a wave-front distortion estimate to an array of phase-difference measurements, J. Opt. Soc. Am., Mar. 1977, pp. 370-375, vol. 67, No. 3.

N. R. Farrar et al., In-situ measurement of lens aberrations, Proceedings of SPIE, (2000), pp. 18-29, vol. 4000.

H. Schreiber, Charakterisierung von SI-Mikrolinsen mit einem lateralen Shearing-Interferometer [Characterization of SI microlenses with the aid of a lateral shearing interferometer], pp. 98-99 (dissertation)(1998).

* cited by examiner

DEVICE AND METHOD FOR WAVEFRONT MEASUREMENT OF AN OPTICAL IMAGING SYSTEM, AND A MICROLITHOGRAPHY PROJECTION EXPOSURE MACHINE

This is a Continuation of International Application PCT/EP2004/000291, with an international filing date of Jan. 16, 2004, which was published under PCT Article 21(2) in German, and the disclosure of which is incorporated into this application by reference.

BACKGROUND OF THE INVENTION

1. Field of the Invention

The invention relates to a device and a method for wavefront measurement of an optical imaging system, and to a microlithography projection exposure machine having a projection lens and comprising such a device.

2. Description of the Related Art

Methods and devices for wavefront measurement are used variously for determining aberrations of optical imaging systems, in particular ultra-precision projection lenses in microlithography projection exposure machines. During wavefront measurement, deviation of the surface shape is determined with reference to an ideal surface shape. Such a deviation is denoted as a wavefront abberation. The imaging quality of an imaging sys-tem can be characterized by determining such aberrations, which can be described, for example, at all field points with the aid of Zernike coefficients. A set of Zernike coefficients can then be determined for each field point, and thus a field distribution can be specified for each Zernike coefficient. This enables a complete description of the spatially low-frequency behavior of all the aberrations of an imaging system.

Laid-open specification DE 101 09 929 A1 describes a device for wavefront measurement of an optical system that has a wavefront source with a two-dimensional structure for generating a wavefront that traverses the optical system, a diffraction grating behind the optical system, and a spatially resolving detector arranged behind the diffraction grating. A shearing interferometry technique in which the diffraction grating is laterally displaced is used for the wave-front measurement.

In addition to the type of wavefront measurement devices outlined above, which operate according to the principle of shearing interferometry, use is frequently made of a second type, which is based on the principle of the Shack-Hartmann pupil shearing. U.S. Pat. No. 5,978,085 describes such a method based on the Shack-Hartmann principle for analyzing an imaging lens system by measuring wavefront aberrations. In this method, a reticle having a structure composed of several small openings is introduced into the object plane. An aperture stop with at least one opening is positioned at a suitable spacing from said reticle. The reticle is imaged through the aperture stop onto the image plane of the lens system, in which a plurality of light spots are produced. In one embodiment the structure of the light spots is recorded by means of a wafer coated with photoresist. The displacements of the measured centroid positions as compared with the ideal, diffraction-limited ones of the light spots are determined by comparing the structures on the wafer with a reference plate that is brought to overlap the wafer and has been exposed with reference structures. These displacements are used to determine the gradient of the wavefront in the pupil of the lens system to be measured, and therefore the aberration of the wave-front.

U.S. Pat. No. 5,828,455 describes a similar method based on the Shack-Hartmann principle. In one embodiment of this method, the structure of the light spots is recorded on a chromium-coated fused silica wafer. The displacements of the structures with reference to the respective ideal position are measured with the aid of an optical measuring instrument. An exposure process for the wafer is required in the case of this method, as well.

One object of the invention is to provide a device and a method that render possible a wavefront measurement of an optical imaging system with relatively low outlay. Moreover, the invention is based on creating a microlithography projection exposure machine that comprises such a device.

SUMMARY OF THE INVENTION

According to one formulation of the invention, this object is addressed by providing a wavefront measurement device which has a wavefront generating unit that is arranged on the object side of the imaging system to be measured and includes an optical element with an object-side periodic structure and a light source unit for illuminating the object-side periodic structure with the aid of a measuring radiation. The wavefront measurement device also has a detector unit that is arranged on the image side of the imaging system to be measured and includes an optical element with an image-side periodic structure and a detector element for detecting an overlay pattern of the imaged object-side periodic structure and image-side periodic structure. The terms object side and image side are to be understood here in the present case to mean generally that they denote the region in the beam path upstream or downstream, respectively, of the optical imaging system to be measured. The wavefront generating unit is designed to restrict the angular spectrum of the measuring radiation emanating from a field point, the design being such that the measuring radiation emanating from at least some of the field points in each case illuminates only a subregion of a pupil plane of the optical imaging system, and the pupil subregions belonging to at least two different field points overlap partially or do not overlap. The field points supplying measuring radiation are typically formed by appropriately transparent structural elements of the object-side periodic structure.

A unique relationship between a respective field point of the object-side periodic structure and an associated pupil subregion can be derived most simply for the case without overlap. However, such a case is not mandatory for the wavefront measurement, that is to say the pupil regions illuminated by neighboring regions of the object-side periodic structure can also overlap partially. What is important is that only a sufficient number of interpolation points fall within the pupil plane for constructing the wavefront computationally, that is to say that the pupil subregions illuminated by corresponding regions of the object-side periodic structure form overall a sufficiently large part of the pupil.

In a development of the invention, the optical element with the object-side structure and/or the optical element with the image-side periodic structure is/are assigned a displacing unit for lateral displacement along one or more periodicity directions. Owing to the use of such a displacement unit, the overlay patterns produced by the periodic structures are evaluated by means of phase shifting, and this ensures a high measuring accuracy.

In a development of the invention, the light source unit includes one or more point light sources that are positioned at a spacing in front of the optical element with the object-side periodic structure such that they illuminate in each case one or more of the structural elements, forming field points, of the object-side periodic structure with an associated, suitable illuminating angle.

In a further refinement of the invention, the wavefront generating unit comprises a single point light source that is positioned at a spacing in front of the optical element with the object-side periodic structure such that the associated illuminating angle thereof is substantially equal to the input-side numerical aperture of the optical imaging system. The point light source illuminates the entire object-side periodic structure. If the structural size of the periodic structure is selected to be sufficiently large by comparison with the wavelength, the angular extent of the light beams diffracted away is relatively small, and the pupil regions illuminated by neighboring field points of the structure differ sufficiently well from one another.

In a development of the invention, the wavefront generating unit comprises one or more extended light sources, positioned in front of the optical element with the object-side periodic structure, as well as a pinhole diaphragm unit that is positioned behind the optical element with the object-side periodic structure. The term "extended" in this case means that the field point or points illuminated by such a light source are illuminated with the aid of a radiation field that includes at least the angular spectrum of the input-side numerical aperture of the optical imaging system. The pinhole diaphragm unit selects the angular spectra, as a result of which each field point can be assigned a position in the pupil plane. For this purpose, the pinhole diaphragm unit includes a respective pinhole, this being understood in the present case as an opening whose dimensioning is selected so as to obtain the desired directional angle limitation for the penetrating radiation. These pinholes that limit the beam direction are, for example, to be distinguished in terms of their generally larger dimensioning from diffraction-limiting pinholes, which serve the purpose of selectively passing, for example, only one order of diffraction of the radiation. This refinement of the invention also comprises mixed forms in which the light source unit comprises one or more point light sources and one or more extended light sources next to one another, those field points that are illuminated by the extended light source or sources each being assigned a pinhole of the pin-hole diaphragm unit for the purpose of selecting the angular spectrum.

In a development of the invention, the image-side periodic structure is located on a detector surface of the detector element, or on a substrate that can be moved laterally relative to a detector surface of the detector element and/or downstream of which there is positioned a detector optical unit for imaging the overlay pattern onto a detector surface of the detector element. The arrangement of the image-side periodic structure on a detector surface of the detector element constitutes a simple and cost effective solution. If the periodic structure is fitted on a laterally movable substrate in front of the detector surface, this can be used for the purpose of lateral phase shifting without the need for shifting the detector. An adaptation of the size of the structures to be detected to the spatial resolution of the detector can be achieved given the use of a detector optical unit positioned downstream.

In a development of the device according to the invention, the first and the second periodic structure each include a moiré structure with one or more periodicity directions. A moiré overlay pattern can determine a unique item of distortion information that suffices for determining the wavefront in two spatial dimensions when said moiré overlay pattern is periodic along at least two non-parallel directions. When the first and the second moiré structure have only one periodicity direction each, the measurement can be executed by introducing two moiré structures each, with different periodicity directions, on the object side and image side next to one another or one after another in time. Alternatively, it is possible to use one moiré structure with two periodicity directions on the object side and/or image side.

The invention further provides a method which uses the device according to the invention for wavefront measurement, and comprises the following steps: positioning the optical element with the object side structure in an object plane, and positioning the optical element with the image-side structure in an image plane of the optical imaging system; producing over-lay patterns of imaged object-side periodic structure and image-side periodic structure, and detecting these patterns by means of the detector element; calculating the spatial derivatives of the wavefront from one or more overlay patterns at different interpolation points that correspond to the pupil subregions illuminated from the respective field point, and reconstructing the course of the wavefront from the wavefront derivatives at the interpolation points.

In a development of the method according to the invention, the optical element with the object-side structure and/or the optical element with the image-side structure are/is displaced laterally along a periodicity direction in order to produce overlay patterns with a different phase offset, it being possible to increase the measuring accuracy thereby.

In a development of the method according to the invention, the device according to the invention is calibrated before carrying out the wavefront measurement. At least two types of calibration method can be used here: a first type, in which the influence of nonideal periodic structures on the measurement is reduced, and a second one, in which the imaging of the field points of the object-side periodic structure on the associated pupil subregions of the optical imaging system is improved.

In a development of the method according to the invention, in order to determine phase information from the respective overlay pattern at an interpolation point, the intensity of the incident measuring radiation is aver-aged over an area of the detector surface that is assigned to the interpolation point and is greater than a period length of the periodic structures.

The invention also provides a microlithography projection exposure ma-chine having a projection lens and a device according to the invention for wavefront measurement at the projection lens.

BRIEF DESCRIPTION OF THE DRAWINGS

Advantageous embodiments of the invention are illustrated in the drawings and described below. Here.

DETAILED DESCRIPTION OF PREFERRED EMBODIMENTS

Figure 1:
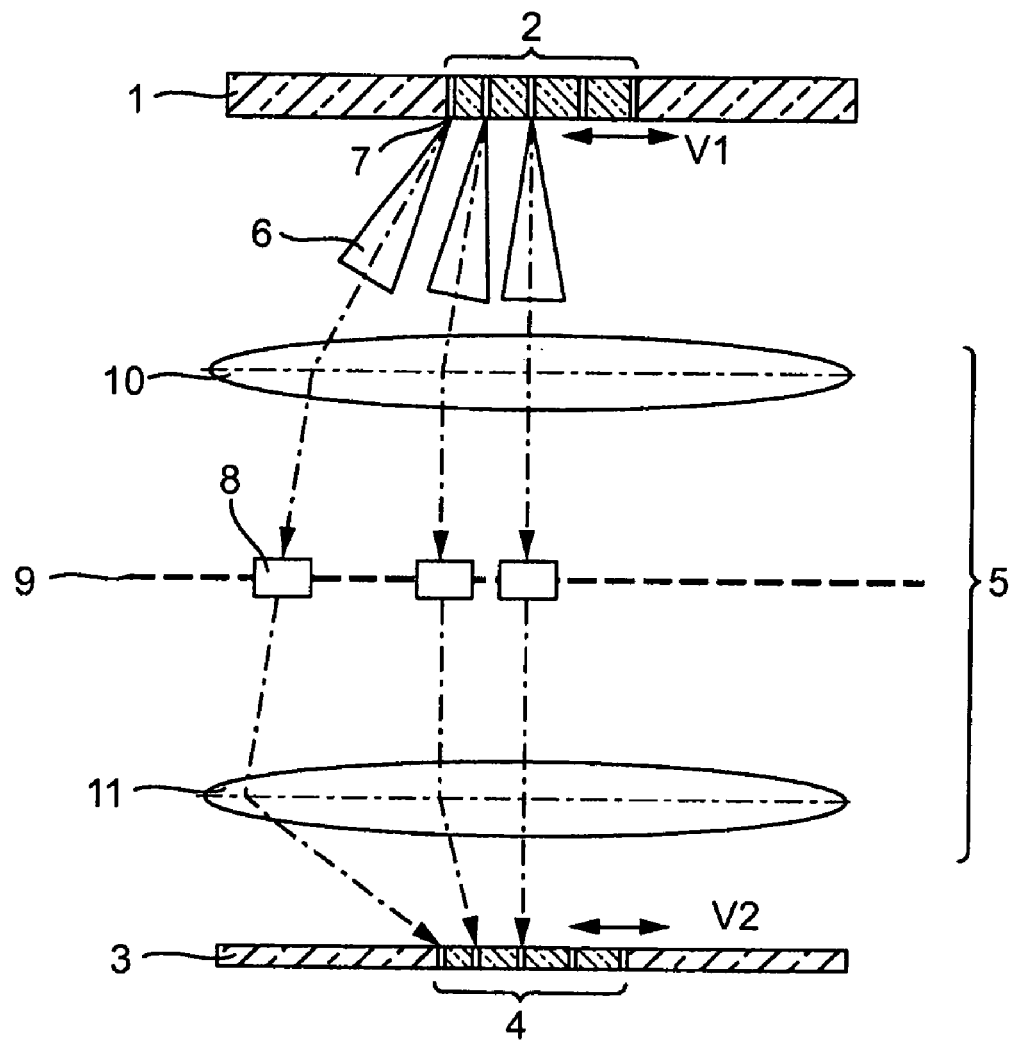
FIG. 1 shows a schematic side view of a device according to the invention for wavefront measurement.

FIG. 1 shows a schematic of a device according to the invention for wavefront measurement on a projection lens 5 for microlithography, having a measuring reticle 1 that is located in the object plane of the lens 5 and has a first periodic moiré structure 2, and is part of a wavefront generating unit not represented further pictorially. For the sake of simplicity, only a first, entrance-side lens 10 and a second, exit-side lens 11 of the projection lens 5 are shown. The lens 5 projects structures applied to the reticle 1 onto a structure carrier 3 that is placed in the image plane of the lens 5 and has a second periodic moiré structure 4 as part of a detector unit not further represented pictorially.

The device shown in FIG. 1 for wavefront measurement is integrated in a microlithography projection exposure machine, for example a wafer scanner, in such a way that it is possible to switch over rapidly between the measurement operation and the lithographic exposure operation of the projection exposure machine. The wavefront generating unit with the measuring reticle 1 can be exchanged for an illuminating reticle that is used for the purpose of semiconductor structuring. For this purpose, the wavefront generating unit can be integrated in a conventional reticle stage, or can alternatively be exchanged for the latter, for which purpose it is appropriately fashioned. The image-side structure carrier 3 with the second moiré structure 4 can likewise be exchanged for a wafer that is to be structured during an exposure process, for which purpose the structure carrier 3 can be integrated on a conventional wafer stage together with the remainder of the detector unit. Alternatively, it is also possible not to integrate the detector unit in the wafer stage, and to exchange the wafer stage for the detector unit during the wavefront measurement.

Alternatively, it is possible to implement the device as an independent measuring station into which the projection lens 5 is introduced for measuring purposes. The wavefront generating unit, also denoted as wavefront sensor or source module, and the detector unit, also denoted as sensor module, are positioned in the measuring station by means of suitable holders on the object side and image side, respectively, of the projection lens 5. It is evident that the device shown is likewise suitable for measuring other optical imaging systems, be this in integrated form or as an independent measuring station.

During operation of the device, measuring radiation used to illuminate the first moiré structure 2 by means of a light source unit (not illustrated in FIG. 1) is diffracted at the first moiré structure 2. Suitable design of the wavefront generating unit, something which will be examined in more detail below in conjunction with FIGS. 2 to 4, ensures that measuring radiation emanating from a respective field point 7, that is to say a transparent subregion of the moiré structure 2, illuminates only an assigned subregion 8 of a pupil plane 9 of the projection lens 5. This is illustrated in FIG. 1 by a conical emission angle spectrum 6 for the transparent field point 7 of the binary moiré structure 2. The pupil subregions 8 illuminated by the various transparent field points 7 do not overlap one another. It is possible, as an alternative, for the pupil subregions 8 to overlap one another partially. It is essential for the wavefront measurement that there be a sufficient number of interpolation points within the pupil plane 9, that is to say that appropriate areas of the measuring reticle 1 illuminate overall a sufficiently large part of the pupil 9, and that there be a unique assignment of the interpolation points or pupil subregions 8 to the individual field points 7 or transparent subregions of the object-side moiré structure 2.

A moiré overlay pattern of an image, produced in the plane of the image-side structure carrier 3, of the first moiré structure 2 is produced by the measuring radiation with the aid of the second, likewise binary moiré structure 4 located there. This overlay pattern is recorded by means of the detector unit and used for aberration measurement, in particular for distortion measurement. The described measuring arrangement permits the image position of each field point 7 projected by the projection lens 5 to be deter-mined in the periodicity direction of the moiré overlay pattern, it being possible to determine the offset of this image position relative to an ideal position by means of a suitable calibration.

The achievable measuring accuracy is a function of how effectively the influence of nonideal moiré structures on the measurement result can be reduced. Various calibration methods known from the literature are on offer for this purpose. For example, it is possible to carry out an absolute measurement of moiré structures outside the device for wavefront measurement, for example by means of a coordinate measuring machine. Measured errors of the moiré structures can be taken into account when calculating the wavefront gradients or when producing appropriately corrected test structures from the phase of the moiré overlay pattern. It is possible as an alter-native or in addition to carry out a calibration by comparing with other methods for wavefront measurement, for example the method described in the journal article by N. R. Farrar et al., "In-situ measurement of lens aberrations", SPIE Proc. 4000, pages 18-29 (2000), or the method known from the above mentioned Laid-open specification DE 101 09 929 A1. The difference between these methods and the method according to the invention can be regarded as a calibration constant that is added onto all following measurements.

In the case of an axially constant calibration as a further calibration variant, the projection lens is rotated relative to the wavefront measuring device, real aberrations co-rotating, to the extent that they are not rotation-ally symmetrical, with the projection lens, whereas measuring artifacts remain rotationally invariant. This permits a calibration, in particular, for an axial field point.

If the first moiré structure 2 has a scale error by comparison with the second moiré structure 4, this linear phase error can be determined by a phase shift over several periods, and subsequent evaluation of the period of the intensity signal.

Furthermore, it is possible to make use of self calibration methods in which firstly an aberration measurement is carried out at any desired field point, after which the periodic structures in the image plane and the object plane of the projection lens are displaced laterally relative to one another by one or more period lengths, and the aberration measurement is repeated. By successively displacing the structures and repeating the aberration measurement as well as integrating measured structural differences, it is possible to determine structural errors in neighboring periods of the structures down to a scale error which can be corrected, for example, by using one of the methods described above for the purpose.

In addition to the calibration of measurement errors produced by non-ideal moiré structures by means of one or more of the above described methods, it can also be expedient to calibrate the assignment between period points and pupil subregions. A "circle fit" method, for example, can be used for this purpose. This utilizes the fact that when an object-side moiré structure is projected into the image plane it is only the subregion that is situated within the usually circular pupil of the optical imaging system that is imaged. Consequently, at an overlay pattern of the object-side moiré structure with an image-side moiré structure, a modulation by phase shifting takes place only within a corresponding, circular region. In order to deter-mine this circular region, a suitably selected modulation and/or intensity criterion is used at a sufficiently large number of interpolation points of a detector that is placed in the image plane to determine border pixels that are still just situated inside or still just situated outside the circle and thus, the pupil edge. A circle is then fitted to these pixels using the least squares error method, the position of the center of the circle and the circular radius serving as free parameters. This permits a unique assignment between the moiré structure and pupil for the pupil midpoint and the pupil edge. The assignment of all further points is performed with the aid of suitable models.

As an alternative or in addition to the "circle fit" method, it is possible to use a calibration method in which the focal position of the detector unit is moved in defined steps in several individual measurements for the same field point. By displacing the detector unit, an accurately defined spherical wavefront aberration is produced in addition to the aberration of the lens. The wavefront differences between various measurements are thereby known exactly. The interpolation points used for measuring aberration must now merely further be assigned to the pupil positions such that the measured aberration differences correspond as accurately as possible to the forecast aberration differences. An optimum assignment between field points of the periodic structure and pupil subregions is thereby then carried out at all interpolation points. Such a calibration technique is set forth in more detail in Laid-open specification EP 1 231 517 A1, for example, to which reference may be made for further details.

The phase of the moiré overlay pattern can be varied by horizontally displacing the first and/or the second moiré structure 2, 4 in the periodicity direction, as indicated in FIG. 1 by double arrows V1, V2. Suitable algorithms such as are described, for example, in the article by G. T. Reid entitled "Moiré Fringes in Metrology", Opt. Lasers Eng. 5 (2), pages 63-93 (1984), can be used to reconstruct the phase from a sequence of intensity values generated by this phase shift, thus permitting a more exact evaluation of the moiré pattern, and consequently a more precise wavefront measurement.

A wavefront tilt, that is to say the gradient of the wavefront at an assigned interpolation point of the respective pupil subregion 8, can be determined from the offset of the pixel of a respective field point 7 of the first moiré structure 2 on the basis of the unique assignment between the field points 7 of the first moiré structure 2, for example, and the pupil subregions 8 of the pupil plane 9, on the other hand. This yields information on the wavefront gradients at all interpolation points of the pupil 9 that are formed by the pupil subregions 8. The wavefront aberrations can be calculated down to an irrelevant constant from these gradients by suitable integration methods. It is possible, for example, to match the derivatives of Zernike polynomials to the wavefront gradients by determining least error squares, as set forth on pages 98-99 of the dissertation by H. Schreiber entitled "Charakterisierung von SI-Mikrolinsen mit einem lateralen Shearing-Interferometer" ["Characterization of SI microlenses with the aid of a lateral shearing interferometer"] (1998), to which reference may be made for further details. Alternatively, it is possible to carry out a pixelwise integration by means of least error squares, as described in the journal article by C. Elster entitled "Exact two-dimensional wavefront reconstruction from lateral shearing interferograms with large shears", Appl. Opt. 39, pages 5353-5359 (2000). It is also possible to integrate into the Fourier domain, as explained in the article by D. L. Fried entitled "Least square fitting a wave-front distortion estimate to an array of phase-difference measurements", J. Opt. Soc. Am. 67, pages 370-375 (1977).

Figure 2:
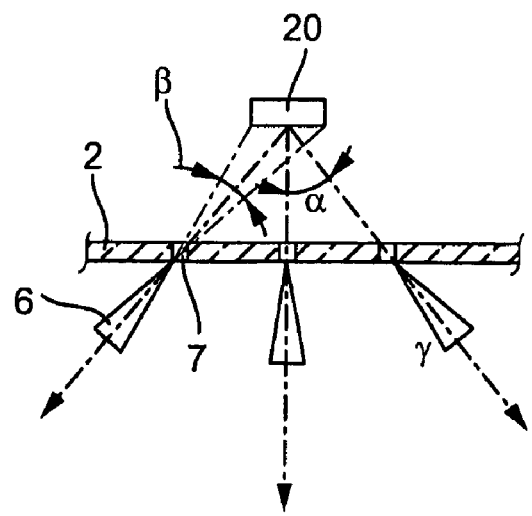
FIG. 2 shows a schematic side view of a wavefront generating unit having a quasi-point light source for the device of FIG. 1.

FIG. 2 shows a schematic side view of a wavefront generating unit for the device of FIG. 1 with an individual quasi-point light source 20 that completely illuminates the first moiré structure 2 during measurement operation. The light source 20 is positioned so close to the moiré structure 2 that the illumination angles required to illuminate the entire structure 2 correspond approximately to the input-side numerical aperture of the projection lens 5 of FIG. 1 that is to be measured. If the moiré structures 2 are sufficiently large when compared with the wavelength of the measuring radiation, the angular spectrum 6 of the measuring radiation is relatively small, and the pupil regions illuminated by neighboring field points 7 differ from one another sufficiently well. The overlap of the pupil regions illuminated by different field points 7 reduces the larger is the selected angle α between the center of the quasi-point light source 20 and the respective field point 7, and the smaller is the selected aperture angle γ of the angular spectrum 6, emitted by the respective field point 7, of the measured radiation. For an ideal point light source, the aperture angle γ is determined only by the spacing of the radiation-emitting field points 7 from the light source, while for the quasi-point light source 20 a role is also played by the angular extent β of the light source 20 seen from the respective field point 7.

Figure 3:
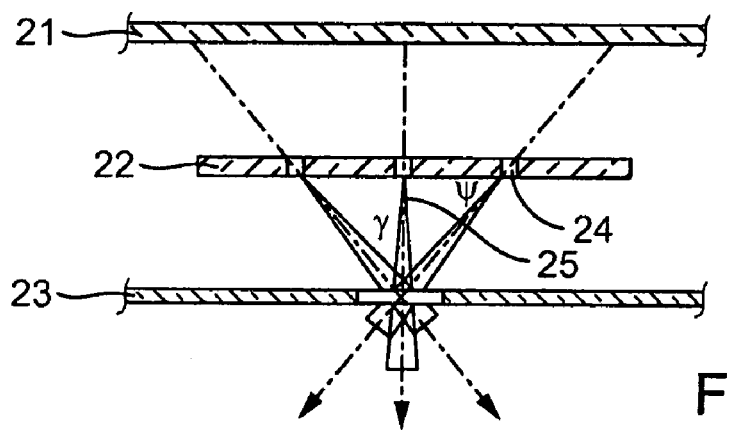
FIG. 3 shows a schematic side view of a wavefront generating unit alternative to that of FIG. 2 and having an extended light source and a pinhole diaphragm for the device of FIG. 1.

FIG. 3 shows a schematic side view of a wavefront generating unit that can alternatively be used in the device of FIG. 1 and has a single ex-tended light source 21 and a pinhole diaphragm unit 23 with a single, suitably narrow passage opening, also termed pinhole, within which a moiré structure 22 is arranged. During measurement operation of the device, the moiré structure 22 is thereby illuminated with the aid of a radiation field that includes the entire angular spectrum of the input-side numerical aperture of the projection lens. The selection is performed on limited angular spectra 25 of field points 24 by means of the pinhole diaphragm unit 23. In FIG. 3, the aperture angle γ of the measuring radiation emitted by the field points 24 is independent of the spacing of the moiré structure 22 from the light source 21, but dependent on the size of the pinhole of the pinhole diaphragm unit 23. The latter should, on the one hand, be so small that only as small as possible a pupil region is illuminated by a respective field point 24. On the other hand, the opening must be large enough that at least two orders of diffraction are passed, and thus the imaging of the field points 24 is ensured. The overlap of the pupil regions illuminated by various field points 24 is a function of the angle γ and of the angle Ψ that is measured from the midpoint of the pinhole of the pinhole diaphragm unit 23 between two neighboring field points 24.

Figure 4:
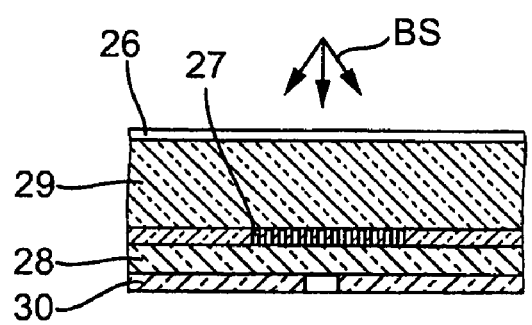
FIG. 4 shows a schematic side view of an advantageous implementation of a wavefront generating unit of the type in accordance with FIG. 3.

FIG. 4 shows a practical implementation of a wavefront generating unit, produced as a monolithic optical component, of the type in accordance with FIG. 3 having a diffusing screen 26 for producing incoherent illumination with complete pupil filling, and a pinhole diaphragm 30. An illuminating radiation 46, indicated by arrows, is scattered at the diffusing screen 26 and passes through a substrate 29 before it strikes a moiré structure 27 that is spaced apart from the pinhole diaphragm 30 by a spacer layer 28. The mode of operation of the wavefront generating unit of FIG. 4 clearly corresponds to that of FIG. 3, and therefore need not be set forth once again in more detail.

In an alternative embodiment (not illustrated), the light source unit for illuminating the optical element with the object-side periodic structure includes several quasi-point light sources situated next to one another of the type of light source 20 from FIG. 2, which are positioned in this case such that they respectively illuminate only some of the field points as a whole. In a further alternative embodiment, the light source unit includes several extended light sources situated next to one another of the type of the light source 21 from FIG. 3, but with a smaller lateral extent, so that each ex-tended light source illuminates only some of the field points as a whole. In accordance therewith, the pinhole diaphragm unit can then include one pinhole each for each group of field points that are illuminated by a respective extended light source. In further alternative embodiments, mixed forms are possible in which the light source unit comprises one or more point light sources and one or more extended light sources which are arranged next to one another such that they serve in each case to illuminate an associated portion of the field point as a whole. Those field points that are illuminated by an extended light source are assigned a suitable pinhole by a corresponding pinhole diaphragm unit, while the field points illuminated by a respective point light source require no pinhole diaphragm structure positioned downstream.

It is to be borne in mind when designing the moiré structures that, on the one hand, the spacings between the field points and grid dimension should be selected to be as large as possible in order to permit local scanning of the pupil with the aid of a large number of interpolation points. In order to ensure a high measuring accuracy in the moiré distortion measurement, on the other hand, the moiré structure should have as large a number of periods as possible over the entire active region, that is to say as small as possible structural elements. In order to extract unique distortion information from a moiré overlay pattern, the moiré structures used to produce this pattern should have a periodicity only along one axis. How-ever, the reconstruction of the wavefront requires knowledge of the distortion at as many points as possible along the at least two axes. A two-dimensional reconstruction of the wavefront is enabled by the moiré structures described below.

Figure 5:
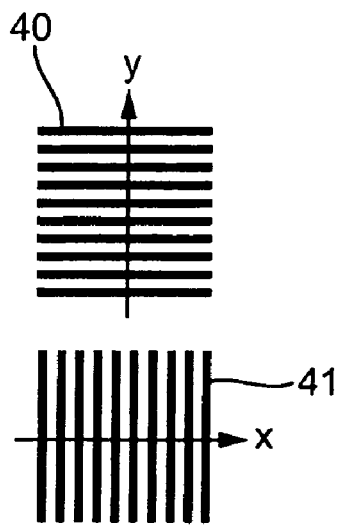
FIG. 5 shows a plan view of two moiré grating structures with periodicity directions rotated by 90° to one another, for use in the device of FIG. 1.

FIG. 5 shows a plan view of two moiré grating structures 40, 41 with periodicity directions rotated by 90° to one another for the purpose of use in the device from FIG. 1. In order to determine the wavefront gradient along the y-direction of an xyz coordinate system, an element with the first moiré grating structure 40 whose periodicity direction points in the y-direction is positioned in the object plane of the projection lens 5 of FIG. 1, and an element with an identical moiré structure reduced by the imaging scale is positioned in the image plane of the same, and a suitable number of measurements are carried out with lateral displacement of the two structures relative to one another, for example by actively displacing the first moiré grating structure 40 in the y-direction, use being made of a suitable displacing device for the purpose. Thereafter, a pair of elements with the second moiré grating structure 41, which is periodic in the x direction, are arranged on the image-side and object-side of the projection lens 5, and the wave-front gradient is correspondingly determined along the x direction. Owing to the measurement of distortion in two directions, a two-dimensional reconstruction of the wavefront can be carried out using one of the algorithms known for the purpose.

As an alternative to the use of one pair each of optical elements with those of one grating structure 40 and with the other grating structure 41 of FIG. 5, it is also possible to use only one element pair with a grating structure that is rotated by 90° between the first and the second measurement.

Figure 6:
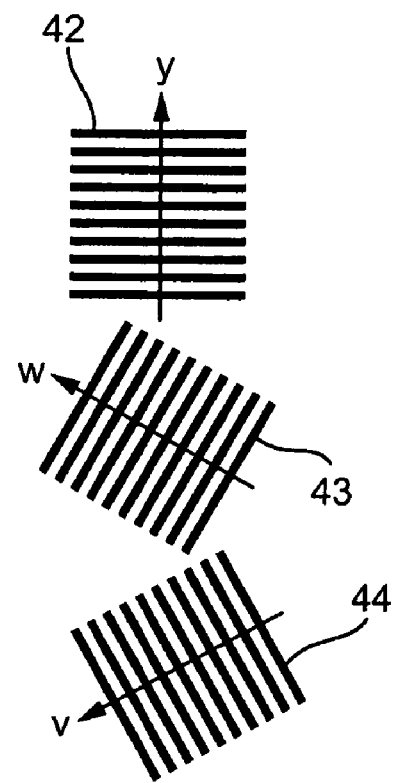
FIG. 6 shows a plan view of three moiré grating structures with differently orientated periodicity directions, for use in the device of FIG. 1.

FIG. 6 shows a plan view of three moiré grating structures 42, 43, 44 with three differently orientated, non-orthogonal periodicity directions y, w, v. As described above, a two-dimensional wavefront measurement can be carried out by means of three consecutive distortion measurements with the aid of these structures. This is possible with increased accuracy be-cause of the use of three different periodicity directions.

Figure 7:
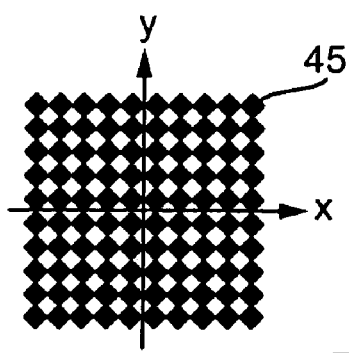
FIG. 7 shows a plan view of a chessboard moiré pattern for use in the device of FIG. 1.

FIG. 7 shows a plan view of a further moiré structure that can be used in the device from FIG. 1 and includes a chessboard moiré pattern 45. In such a pattern, periodic structures are combined along two mutually perpendicular axes x and y. Unique information on the distortion can be extracted by successively determining the wavefront gradient along one of the periodicity directions in each case. Shifting the phase perpendicular to the direction in which the wavefront gradient is currently to be determined, and averaging over the intensities of the moiré overlay patterns thus produced causes the periodicity to vanish along this perpendicular direction. It is possible alternatively or in addition to carry out phase shifts in various directions one after another, the intensities thus produced in the various overlay patterns including only relevant information on the wavefront gradients in the respective phase shift direction, while the influence of the other respective directions can be caused to vanish.

The moiré structures shown in FIGS. 5, 6 and 7 can also be combined with one another. Thus, for example, one of the structures shown in FIG. 5 can be used on the object side, and the structure shown in FIG. 7 can be used on the image side.

Figure 8:
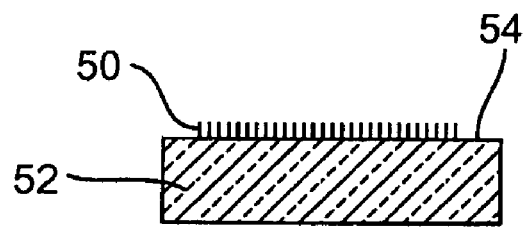
FIG. 8 shows a schematic side view of a detector unit with a periodic structure on a detector surface for the device of FIG. 1.

FIG. 8 shows a detector unit with a detector element 52 and a periodic moiré structure 50 for use in the device from FIG. 1. The detector element 52 includes a CCD array with a detector surface 54 for reading out the moiré overlap pattern in parallel. It is also possible to use detectors that do not operate in parallel and supply spatially resolved information on raster scanning of the image field, for example using a pinhole diaphragm with a photodiode positioned downstream. In this example, the periodic structure 50 is applied directly to the detector surface 54 and is positioned for the purpose of wavefront measurement in the image plane of the projection lens 5 from FIG. 1.

Figure 9:
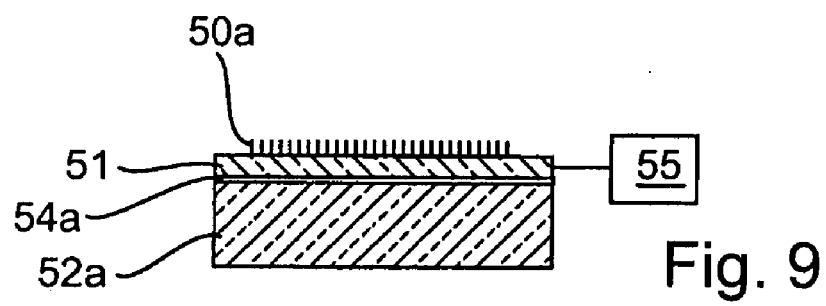
FIG. 9 shows a schematic side view of a detector unit with a periodic structure on a laterally movable substrate for the device of FIG. 1.

FIG. 9 shows an alternative detector unit with a periodic structure 50*a* on a carrier or transparent substrate 51 that is arranged in a laterally movable fashion in front of a detector surface 54*a* of a CCD detector element 52*a*. Displacing the substrate 51 by means of a displacing unit 55 permits a phase shift in the image plane without requiring the detector unit 52a to be moved as well. The periodic structure 50a is positioned for the purpose of wavefront measurement in the image plane of the projection lens 5 from FIG. 1.

Figure 10:
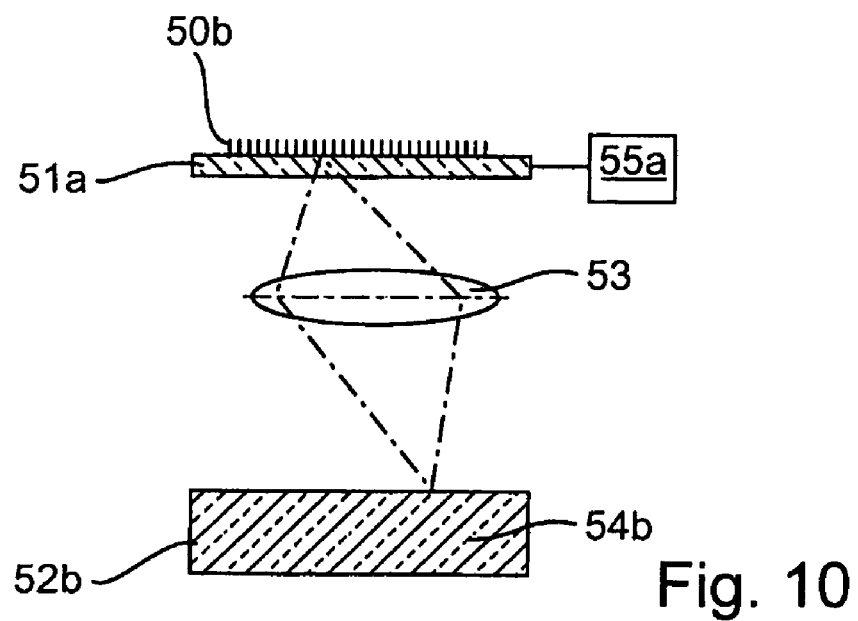
FIG. 10 shows a schematic side view of a relay optical unit comprising a detector unit for the device of FIG. 1.

FIG. 10 shows a further alternative detector unit with a CCD detector element 52b and a detector optical unit 53 that is positioned upstream thereof and images onto a detector surface 54b of the CCD detector element 52b a periodic structure 50b that is applied to a transparent substrate 51a. Displacing the substrate 51a by means of a displacing unit 55a enables a phase shift in the image plane. The detector surface 54b picks up an image of the periodic structure 50b enlarged by the linear magnification of the detector optical unit 53, thereby facilitating an adaptation of the size of the structural element of the periodic structure to the spatial resolution of the detector.

In the detector units shown in FIGS. 8 to 10, the intensity of the incident measuring radiation is averaged, for the purpose of evaluating the phase information from the respective overlay pattern at a respective interpolation point, over a pixel area, assigned to the interpolation point, of the CCD array that is greater than a period length of the periodic structures. This ensures that the desired phase information can be extracted. The measuring accuracy increases with the size of the intensity averaging area, and so the latter should be selected to be as large as possible, there being a need to ensure that an adequate number of interpolation points still re-main in the pupil plane.

The device described and the method described for wavefront measurement are not limited to the measurement of projection lenses for micro-lithography, but can be used to measure any desired optical imaging systems. The wavefront measuring operation according to the invention is carried out by means of a wavefront generating unit and a detector unit that can be used to measure wavefronts simultaneously in parallel, that is to say at all field points under consideration. Alternatively, implementations of the wavefront measuring device are also possible in which the wavefront generation and/or the wavefront detection is/are carried out sequentially, that is to say consecutively for the individual field points.

When the device is used in a wafer scanner or wafer stepper, this is held so stably that vibrations, drifts or static positioning errors have no effect on the measuring accuracy. When lasers are used to provide the measuring radiation, fluctuations in the laser intensity can be kept sufficiently small by averaging over many pulses, or can be calibrated away by intensity monitoring. The spectral behavior of lasers is sufficiently constant over time, and so the illumination has no influence on the reproducibility of the measuring accuracy. Consequently, the measuring accuracy is deter-mined essentially by the accuracy of the phase calculation from the moiré overlay patterns. Factors important for high accuracy are a sufficiently ac-curate positioning of the image-side and/or object-side structure during phase shifting, and the number of the spatial periods over which the intensity is averaged. The reproducible measuring accuracy of the device de-scribed here can be approximately 1 nm for low Zernike coefficients. As an alternative to moiré structures, it is also possible to make use in the device according to the invention of other periodic structures whose overlap pat-terns can be used to reconstruct the course of the wavefront.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all changes and modifications as fall within the spirit and scope of the invention, as defined by the appended claims, and equivalents thereof.

The invention claimed is:

1. A device for wavefront measurement of an optical imaging system, comprising:
   a wavefront generating unit arranged on the object side of the imaging system to be measured and comprises an optical element with an object-side periodic structure and a light source unit for illuminating the object-side periodic structure with the aid of a measuring radiation, and
   a detector unit arranged on the image side of the imaging system to be measured and comprises an optical element with an image-side periodic structure and a detector element for detecting an overlay pattern of the imaged object-side periodic structure and image-side periodic structure,
   wherein the wavefront generating unit is designed to restrict the angular spectrum of the measuring radiation emanating from a field point, the design being such that at least the measuring radiation emanating from a first and a second field point respectively illuminates only a subregion of a pupil plane of the optical imaging system, and wherein the pupil subregion belonging to the first field point at most partially overlaps the pupil subregion belonging to the second field point.

2. The device as claimed in claim 1, wherein at least one of the optical element with the object-side structure and the optical element with the image-side periodic structure is assigned a displacing unit for lateral displacement along at least one periodicity direction.

3. The device as claimed in claim 1, wherein the light source unit comprises at least one point light source that is positioned at a spacing in front of the optical element with the object-side periodic structure such that the at least one point-light source illuminates assigned field points with an appropriately restricted angular spectrum.

4. The device as claimed in claim 3, wherein the light source unit comprises a single point light source that is positioned at a spacing in front of the optical element with the object-side periodic structure such that the associated illuminating angle thereof is at least substantially equal to the input-side numerical aperture of the optical imaging system.

5. The device as claimed in claim 1, wherein the light source unit comprises at least one extended light source, positioned in front of the optical element with the object-side periodic structure, as well as a pinhole diaphragm unit with at least one pinhole that is positioned behind the optical element with the object-side periodic structure.

6. The device as claimed in claim 1, wherein the image-side periodic structure is located on a detector surface of the detector element.

7. The device as claimed in claim 1, wherein the image-side periodic structure is located on a substrate configured to be moved laterally relative to a detector surface of the detector element.

8. The device as claimed in claim 1, further comprising a substrate and a detector optical unit, located downstream of the substrate, for imaging the overlay pattern onto a detector surface of the detector element.

9. The device as claimed in claim 1, wherein the first and the second periodic structure each include a moiré structure with one or two periodicity directions.

10. A method for wavefront measurement of an optical imaging system having a device as claimed in claim 1, comprising:
- positioning the optical element with the object-side structure in an object plane, and positioning the optical element with the image-side structure in an image plane of the optical imaging system,
- producing overlay patterns of imaged object-side periodic structure and image-side periodic structure, and detecting these patterns by means of the detector element,
- calculating the spatial derivatives of the wavefront from one or more overlay patterns at different interpolation points that correspond to the pupil subregions illuminated from the respective field point, and
- reconstructing the course of the wavefront from the wavefront derivatives at the interpolation points.

11. The method as claimed in claim 10, wherein at least one of the optical element with the object-side structure and the optical element with the image-side structure is displaced laterally along a periodicity direction in order to produce overlay patterns with a different phase offset.

12. The method as claimed in claim 10, wherein the device for wavefront detection is calibrated before carrying out the wavefront measurement.

13. The method as claimed in claim 10, wherein, in order to determine phase information from the respective overlay pattern at an interpolation point, the intensity of the incident measuring radiation is averaged over an area of the detector surface that is assigned to the interpolation point and is greater than a period length of the periodic structures.

14. A microlithography projection exposure machine comprising:
- a projection lens, and
- a device for wavefront measurement at the projection lens as claimed in claim 1.

* * * * *